United States Patent
Jensen et al.

(10) Patent No.: US 6,362,762 B1
(45) Date of Patent: Mar. 26, 2002

(54) MULTIPLE MODE ANALOG-TO-DIGITAL CONVERTER EMPLOYING A SINGLE QUANTIZER

(75) Inventors: Henrik T. Jensen, Brentwood; Gopal Raghavan, Thousand Oaks, both of CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 09/645,072

(22) Filed: Aug. 23, 2000

(51) Int. Cl.[7] .............................................. H03M 3/00
(52) U.S. Cl. ...................................... 341/143; 341/141
(58) Field of Search ................................. 341/143, 141

(56) References Cited

U.S. PATENT DOCUMENTS 5,196,852 A   3/1993   Galton
5,896,101 A   4/1999   Melanson

OTHER PUBLICATIONS

Raghaven, G., et al., "A bandpass ΣΔ Modulator with 92sB SNR and Center Frequency Continuously Programmable from 0–70 Mhz", 1997 IEEE International Solid State Circuits Conference, Section FP 13.4.
Hairapetian, A., "An 81 MHz IF Receiver in CMOS", IEEE Journal of Solid State Circuits, vol. 21, No. 12, Dec. 1996.
Candy, J.C., et al., "Oversampling Methods for Data Conversion", IEEE Pacific Rim Conference on Communications, Computers, and Signal Processing, May 9–10, 1991, pp. 498–502, 910–913.
ADC and DAC, Chapter 3, *The Scientist and Engineer's Guide to Digital Signal Processing*, pp. 35–66.
Analog Devices, ADC–system on the ADMC300, Configuration and utilizing the Sigma Delta system, Application note: AN300–5, pp. 1–10.
Kester, W., et al., High Resolution Signal Conditioning ADC's, Section 3.
Black, B., "Analog to Digital Converter Architectures and Choices for System Design", Analog Dialogue 33–8, (© Analog Devices), pp. 1–4.
Wang, X. et al., cascaded Parallel Oversampling Sigma–Delta Modulators, IEEE Transactions on Circuits and Systems–II: Analog and Digital Signal Processing, IEEE, vol. 47 No. 47, Feb. 2000, pp. 156–161.*
Jensen, H. et al., A robust Parallel Delta–Sigma A/D Converter Architecture, IEEE, 1995 IEEE Symposium on Circuits and Systems, 1995, pp. 1340–1343.*
Lyden, C. et al., A Parallel Sigma–Delta Modulator, IEEE, Third Int. Conf. on Advanced A/D and D/A Conversion Techniques and Their Applications, Jul. 1999, pp. 42–45, (Conf. Publ. No. 466).*
Faraq, E. et al. A Novel Architecture for a Switched–Capacitor Bandpass Sigma–Delta Modulator, IEEE 1997Proceedings of 40th Midwest Symposium on Circuits and Systems, Conf. Date Aug. 1997, pp. 9–12.*
Yiu, W. et al., A Bandpass Sigma–Delta for Software Low–Power and Low–Voltage Radio by Using PATH Technique, IEEE Proceedings Ninth Great Lakes Symposium on VLSI, Mar. 4–6, 1999, pp. 198–201.*

* cited by examiner

Primary Examiner—Howard L. Williams
(74) Attorney, Agent, or Firm—Ladas & Parry (57) ABSTRACT

Several delta-sigma modulator circuits and a single quantizer provide analog-to-digital conversion for multiple frequency bands. A wideband mode is provided by coupling an analog signal to be digitized directly to a quantizer. Narrowband modes are provided by switching the analog signal to be digitized into one of several delta-sigma modulator circuits. Noise shaping and filtering by the delta-sigma modulator circuits result in improved signal-to-noise-and-distortion performance and increased resolution. Performance is further enhanced by feeding back multiple bits output by the quantizer to the delta-sigma modulator circuits. The delta-sigma modulator circuits can be either continuous time or discrete time delta sigma modulators.

19 Claims, 8 Drawing Sheets

MULTIPLE MODE ANALOG-TO-DIGITAL CONVERTER EMPLOYING A SINGLE QUANTIZER

FIELD OF THE INVENTION

The present invention relates to analog to digital converters (ADCs). More particularly, the present invention relates to ADCs that support both wide and narrow frequency bands.

BACKGROUND OF THE INVENTION

A number of Radio-Frequency (RF) applications, such as digital radar systems, require analog-to-digital converters that will support challenging requirements for bandwidth, resolution, and dynamic range. A typical application may require analog-to-digital conversion for analog signals within one of several different 10 MHz bandwidths at a resolution of 15 signal-to-noise-and-distortion (SINAD) bits and analog-to-digital conversion for analog signals over a 1 GHz bandwidth at a resolution of 9 bits. Each separate bandwidth is considered a separate mode of analog-to-digital conversion. Each mode can be provided by separate analog-to-digital converters, but to reduce power, area, and cost, it is desired that the analog-to-digital converter units be highly integrated.

Figure 1A:
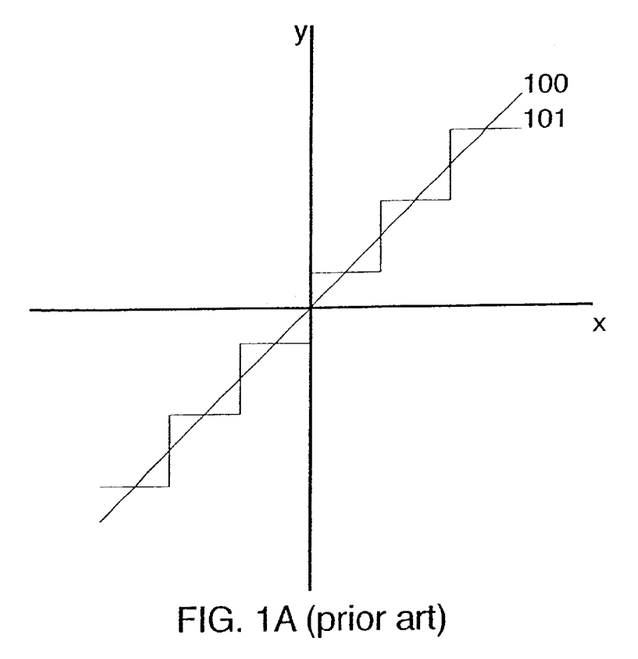
FIG. 1A (prior art) shows a plot of quantization steps for a multi-level quantizer.
Figure 1B:
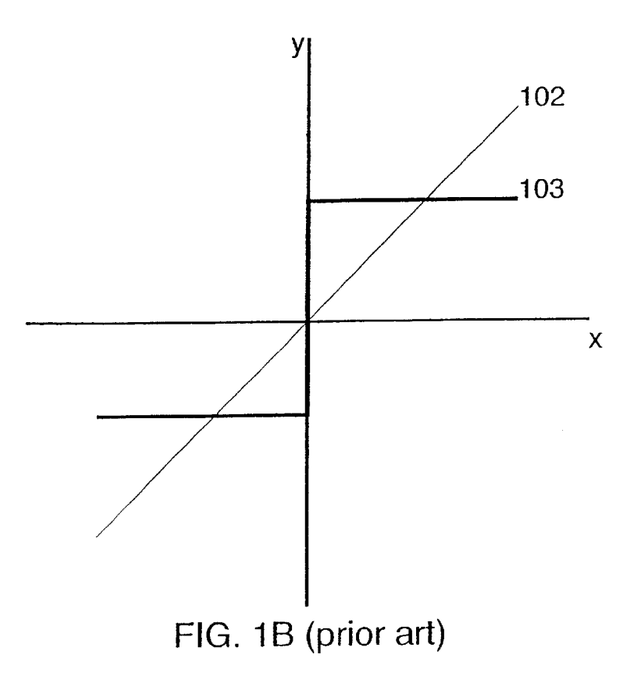
FIG. 1B (prior art) shows a plot of quantization steps for a two level quantizer.

Analog to digital data conversion involves quantization of the analog input signal. Quantization required for analog to digital conversion may be multi-level quantization as illustrated in FIG. 1A or two-level quantization as illustrated in FIG. 1B. The quantization process is described by the equation $$y = Gx + e$$

G is the slope of the straight line going through the centers of the quantization steps and e is the quantization error or quantization noise. In FIG. 1A, the slope is indicated by the diagonal line 100 and the quantization steps are indicated by stair-step line 101. In the two-level quantizer shown in FIG. 1B, the slope is indicated by the diagonal line 102, and the two quantization levels are shown by the two-state line 103. The error term e can be modeled as random additive noise with a uniform amplitude distribution, which has an impact on the performance of the analog-to-digital converter.

Figure 2A:
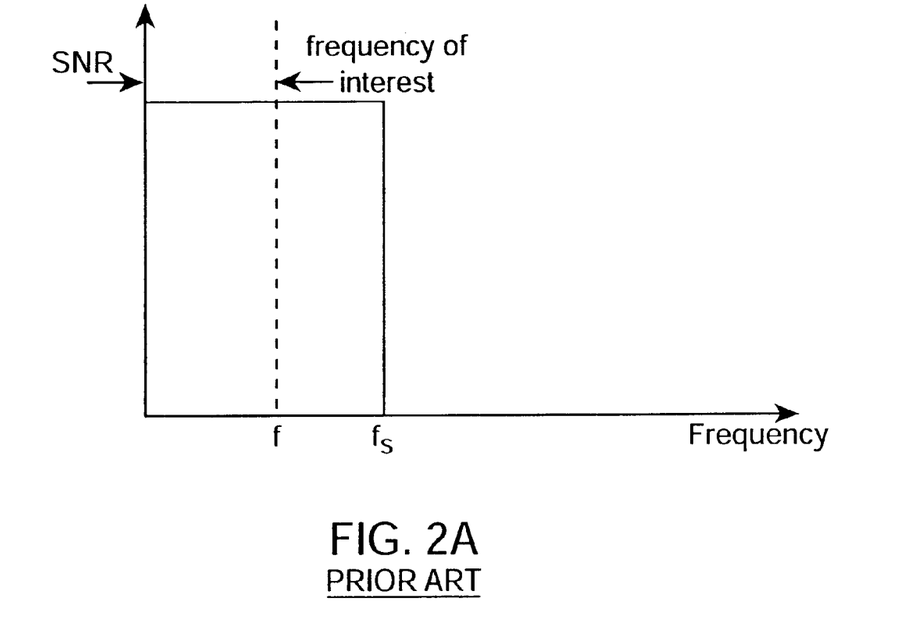
FIG. 2A (prior art) shows a plot of the signal-to-noise ratio for a signal sampled at the minimum sampling rate.
Figure 2B:
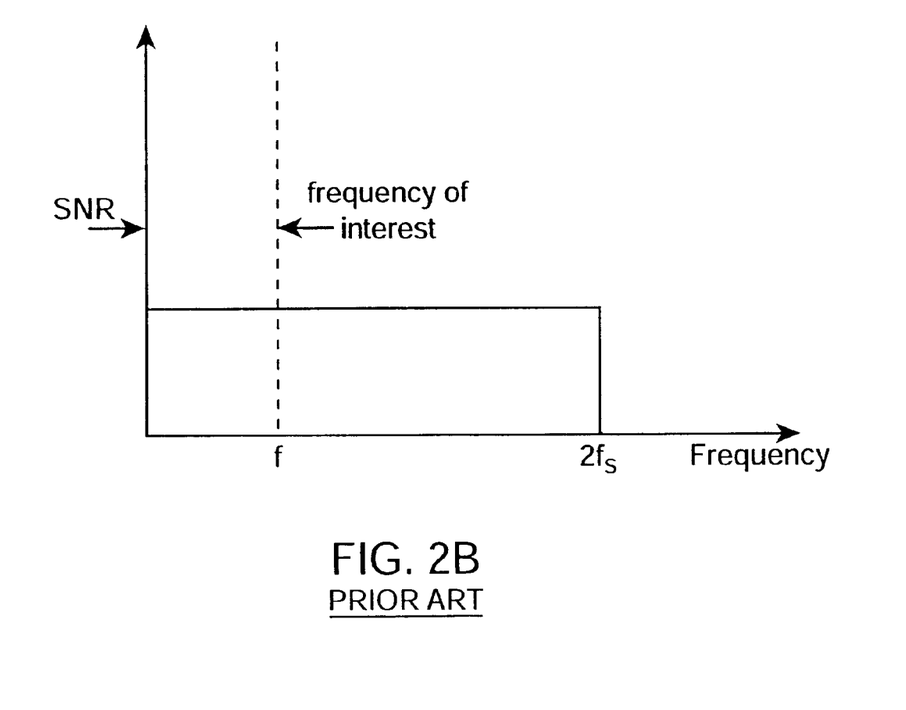
FIG. 2B (prior art) shows a plot of the signal-to-noise ratio for a signal sampled at twice the minimum sampling rate.

One method for reducing the quantization noise is through oversampling. It is well known that to recover a sampled analog signal, the signal must be sampled at a rate greater than or equal to twice the signal frequency, otherwise known as the Nyquist sampling rate. Oversampling refers to sampling the signal at a rate much greater than twice the signal frequency. FIG. 2A shows the magnitude of quantization noise, in terms of the signal-to-noise (SNR), at a particular frequency of interest f when the analog signal is sampled at the minimum sampling rate of $f_s$. FIG. 2B shows the magnitude of quantization noise at the same frequency of interest when the signal is sampled at a sampling rate equal to $2f_s$. By comparing the quantization noise in FIG. 2A and FIG. 2B, respectively, one can see that increasing the sampling frequency spreads the quantization noise over a larger bandwidth because the total quantization noise remains the same over the different sampling bandwidths. Thus, increasing the sampling rate relative to twice the signal frequency, or oversampling, reduces the quantization noise in the bandwidth of interest.

Figure 3:
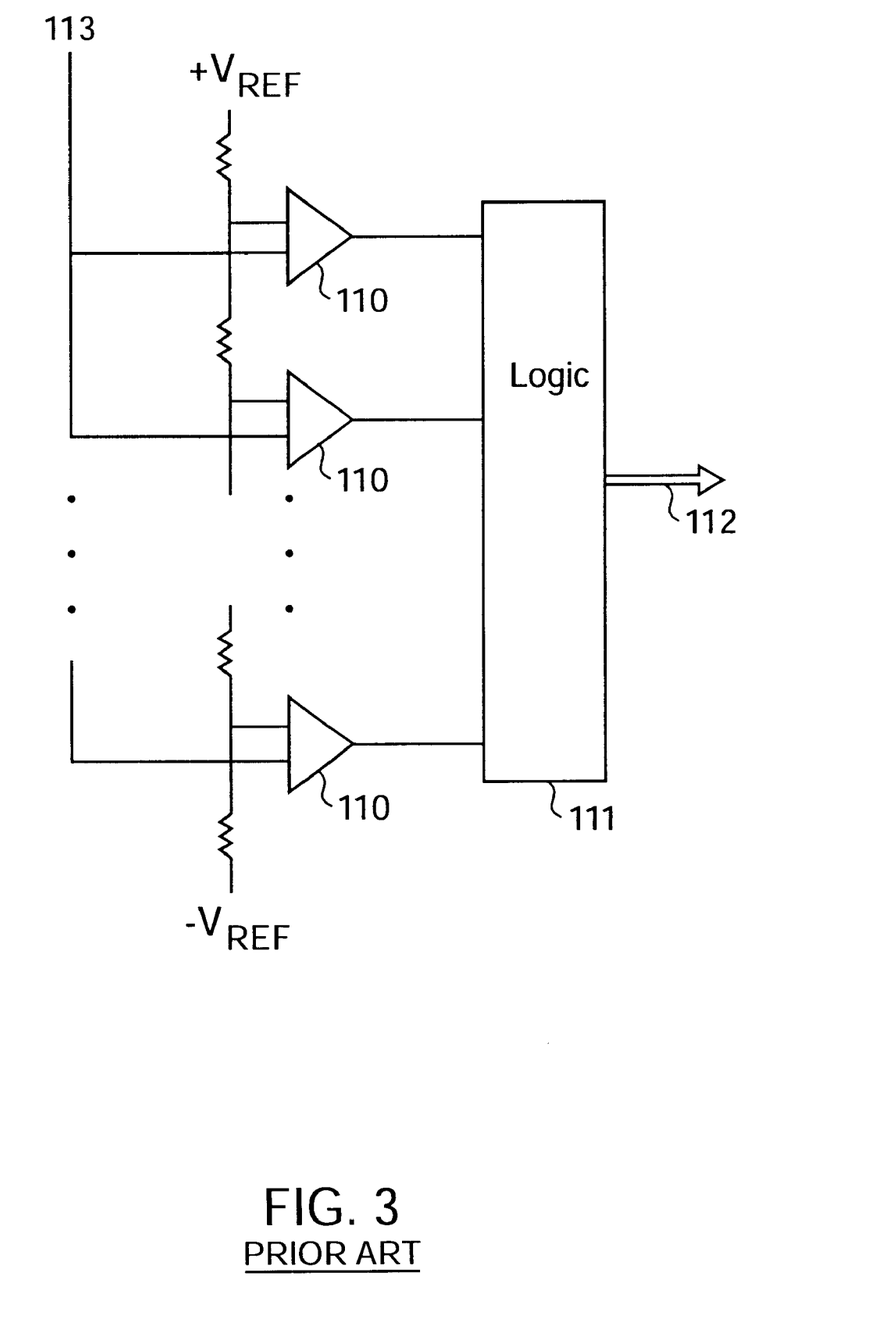
FIG. 3 (prior art) is a block diagram of a flash analog-to-digital converter.

A common architecture for analog-to-digital converters that support high frequency quantization rates is a flash architecture as illustrated in FIG. 3. In FIG. 3, $2^n-1$ comparators 110 are used to directly measure an analog signal 113 to a resolution of n bits. The outputs from the multiple comparators simultaneously present $2^n-1$ discrete digital output states, which are then level decoded 111 into a binary form 112. The flash architecture is very fast, and thus has the advantage of easily operating at the quantization rates required to meet Nyquist sampling rate requirements for extremely high frequency analog signals. However, the flash architecture requires many comparators for high bit resolution, with a corresponding increase in power, size, and circuit complexity. For example, a 9-bit flash analog-to-digital converter would require 511 comparators, while a 15-bit flash analog-to-digital converter would require 32767 comparators. Hence, the large number of comparators required for high resolution is a major limitation for a flash analog-to-digital converter.

Resolution of a flash analog-to-digital converter is also limited by its quantization noise performance. The effective resolution or effective number of bits (ENOB) of the analog-to-digital converter is given by:

$$ENOB = \frac{SNR - 1.76\text{dB}}{6.02\text{dB}}.$$

If only the effect of quantization noise is considered, the effective number of bits is equivalent to the signal-to-noise and distortion (SINAD) bits. As described above, the quantization noise will the highest and, therefore, the SNR will be the lowest when the ADC is operating at the Nyquist sampling rate. If oversampling is used, the quantization noise will decrease and the SNR will increase, thus providing additional resolution. However, when only oversampling is used to increase resolution, the sampling frequency must increase by a factor of $2^{2N}$ to obtain an N-bit increase in SINAD resolution. Hence, each doubling of the sampling frequency can only achieve a 0.5 bit increase in SINAD resolution. Thus, a high resolution flash analog-to-digital converter incurs a bandwidth penalty for increased resolution.

Figure 4A:
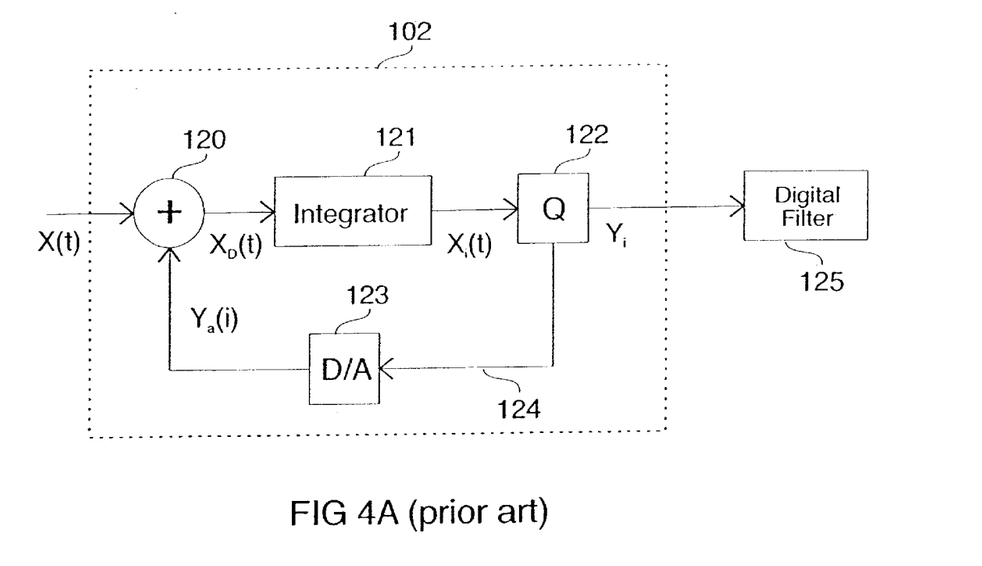
FIG. 4A (prior art) is a block diagram of a continuous time delta-sigma modulator.

A delta-sigma modulator achieves additional SINAD bits with less of a bandwidth penalty by combining oversampling with a noise-shaping technique. A basic block diagram of a delta-sigma modulator is shown in FIG. 4A. The delta-sigma modulator comprises a summing node 120, an integrator 121 and a quantizer 122 coupled together in succession. A feedback loop 124 couples the Output Y(i) of the quantizer 122 to the summing node 120 through a digital-to-analog converter 123. In operation, an analog input signal enters the summing node 120 where an analog version of the feedback signal $Y_a(i)$ is subtracted from it to create a difference signal $X_d(t)$. The difference signal is then input to the integrator 121 that produces an integral signal $X_i(t)$. The quantizer then rounds the integral signal $X_i(t)$ to the nearest quantization level thereby producing a digital signal $Y_i$. The feedback loop 124 forces the average output of the quantizer to track the input signal X(t) and thus provide a digitized version of the analog input signal.

In a delta-sigma modulator, the integrator, which is a low pass filter, acts to push the quantization noise up in frequency. This feature is explained by referencing the discrete time model of the delta-sigma modulator shown in FIG. 4B. A sampled version of an analog signal, X(i), enters the summing node 120 where the feedback signal $Y_a(i)$ is subtracted from it to create the sampled difference signal $X_d(i)$. The integrator 121 is implemented with a discrete time integrator comprising a delay element 126 and a feedback element 127. The integrator 121 produces an integral signal $X_I(i)$. The quantizer 122 is modeled as a noise source E(i) coupled to summing node 128. Moreover, the digital-to-analog converter 123 can be treated as ideal, and modeled as a unity gain transfer function.

Figure 4B:
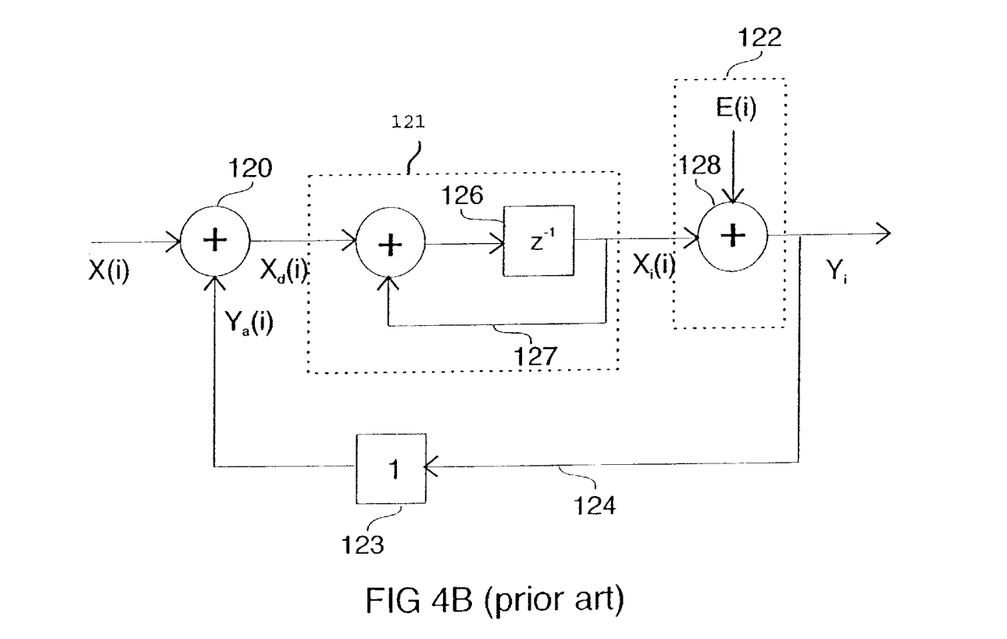
FIG. 4B (prior art) is a block diagram of a discrete time model of a delta-sigma modulator.

The output of the discrete time delta-sigma modulator can be written as $$Y(i)=X_I(i)+E(i)$$

where $X_I$ as the output of the discrete time integrator can be written as:

$$X_I(i)=X(i-1)-E(i-1)$$

Thus, $$Y(i)=X(i-1)+(E(i)-E(i-1))$$

In the z-domain, the output is given by $$Y(z)=X(z)z^{-1}+E(z)(1-z^{-1})$$

Thus, the transfer function for the input signal, $H_x(z)$ is equal to $z^{-1}$ and the transfer function of the noise source, $H_n(z)$ is equal to $(1z^{-1})$. Since zero frequency is represented in the z domain at z=1, it can readily be seen that as the frequency approaches zero, E(z) is attenuated. Therefore, the integrator in the delta-sigma modulator provides that the delta-sigma modulator acts as a high pass filter for quantization noise, and a lowpass filter for the input signal.

The example above shows a first order delta-sigma modulator, where only a single order integrator is used. It is known in the art that the first order delta-sigma modulator described above provides up to an additional 1.5 SINAD bits of analog-to-digital conversion resolution for every doubling of the sampling frequency. Thus, the over sampling and noise shaping techniques implemented by the delta-sigma modulator can provide more resolution than just the over sampling technique used with a flash converter ADC. Also, additional orders of integration provide additional resolution for the same amount of oversampling.

When an integrator is used in a delta-sigma modulator, the noise shaping that is achieved is simply that of a low pass filter. However, it is known in the art that the integrator in a delta-sigma modulator can be replaced with a bandpass filter. If the integrator is replaced with a bandpass filter, the delta-sigma modulator will also act as a bandpass filter, where only the frequencies of the analog input signal within the passband will be output by the modulator. In addition, the quantization noise is moved up and down in frequency to leave a virtually noise-free region in the passband.

A typical implementation of a delta-sigma modulator uses a one bit quantizer, since a one bit quantizer is essentially just a comparator. Comparators that can operate at high frequencies of 10 GHz or greater are well known in the art. When a single bit quantizer is used in a discrete time version of the delta-sigma modulator, the output of the delta-sigma modulator will be a stream of bits (one and zeros) at the sampling rate used on the analog input signal. To make use of the high frequency bit stream from the modulator, the bit stream is digitally filtered. When an integrator is used in the delta-sigma modulator, the digital filter is usually formed as a digital low-pass filter, which performs two important functions. As discussed above, the output from the delta-sigma modulator still contains high band quantization noise, which is finally suppressed by the low pass digital filter. Additionally, the lowpass filter performs a decimation of the high frequency bit stream to form a multi-bit parallel output code. If delta-sigma modulator is configured to act in a bandpass fashion, the digital filter on the output would be formed as a digital bandpass filter.

Delta-sigma modulators can also be implemented by using a multi-bit quantizer with a single or multiple bit digital-to-analog converter in the feedback path. One such configuration is disclosed by J. C. Candy and G. C. Temes in "Oversampling Methods For Data Conversion," IEEE Pacific Rim Conference on Communications, Computers, and Signal Processing, May 9–10, 1991, p. 499, which is incorporated herein by reference. Candy and Temes disclose a delta-sigma modulator where the quantizer is a multi-bit quantizer and the most-significant-bit (MSB) of the quantizer output is fed back to be subtracted from the input signal. The output of the multi-bit quantizer and the MSB are also fed forward for additional digital signal processing. Candy and Temes state that in this delta-sigma modulator configuration, if the multi-bit quantizer uses N bits, a resolution enhancement of an additional N−1 bits can be achieved.

Increasing the order of the integrator used within the delta-sigma modulator and using a multi-bit quantizer with multi-bit feedback also provides additional SINAD bits. J. L. Melanson in U.S. Pat. No. 5,896,101, issued Apr. 20, 1999, discloses a delta-sigma modulator that uses multiple bit feedback into multiple orders of integration to provide better prediction of the in-band quantization error and improved SINAD performance. This invention uses an oversampling technique where the sampling frequency is 64 to 512 times the overall bandwidth of the delta-sigma modulator. Hence, the frequency coverage of the analog-to-digital converter disclosed by Melanson is limited to a fraction of the overall sampling frequency. Thus, the invention disclosed by Melanson provides narrow frequency band coverage, but is inappropriate for use in wide frequency band applications.

Various techniques can be used to provide a wide frequency band capability for an analog-to-digital converter. As discussed above, the flash architecture inherently provides a wide frequency band analog-to-digital converter. Delta-sigma modulators can also be used to construct wideband analog-to-digital converters. I. A. Galton in U.S. Pat. No. 5,196,852, issued Mar. 23, 1993, discloses an analog-to-digital converter comprising multiple delta-sigma modulators, all operating on the same input signal. The parallel channels can be configured so that the analog-to-digital converter will provide wide band coverage, but each delta-sigma modulator requires a separate quantizer and additional digital filtering to implement the analog-to-digital conversion function. These additional components add size, complexity, and power consumption to the analog-to-digital converter. In addition, the invention disclosed by Galton does not provide the capability to cover multiple frequency bands.

A need remains in the art for an analog-to-digital converter that can provide both wide and narrow frequency band coverage. The analog-to-digital converter must also be highly integrated to provide decreased complexity, size, and power consumption.

SUMMARY OF THE INVENTION

An object of the present invention is to provide a method and apparatus for analog-to-digital conversion that can provide both wide and narrow frequency band coverage. An additional object of the present invention is to provide a highly integrated apparatus for such analog-to-digital conversion.

A single quantizer is operated at the Nyquist sampling rate to provide analog-to-digital conversion of signals over a wide frequency range up to one-half of the Nyquist frequency. This quantizer can be either a single-bit or multiple-bit quantizer using analog-to-digital converter architectures known in the art, such as a flash architecture.

Narrow frequency band analog-to-digital conversion is provided by using a delta-sigma modulator circuit to feed a quantizer that provides an analog-to-digital converter output signal and a feedback signal to the delta-sigma modulator. The feedback signal contains one or more of the digital bits output by the quantizer. The delta-sigma modulator can be of any order and can be constructed to provide either lowpass or bandpass characteristics. Selection of the delta-sigma modulator parameters will determine the frequency response of the narrowband analog-to-digital converter. Multiple delta-sigma modulators provide multiple frequency bands of operation.

A single quantizer supports both wide and narrow frequency bands by routing the input to the analog-to-digital converter either directly to the input to the quantizer or to the input of a selected delta-sigma modulator circuit. The output of the selected delta-sigma modulator circuit is then connected to the quantizer. A delta-sigma modulator circuit for a narrowband mode is selected by activating both an input switch and an output switch for the selected delta-sigma modulator circuit while deactivating the switches for all other delta-sigma modulator circuits. The wideband mode is selected by deactivating the switches for all the delta-sigma modulator circuits, while activating a switch that connects the ADC input to the quantizer input.

The delta-sigma modulator circuit may correspond to a continuous-time modulator, where the filters used within the delta-sigma modulator are derived from analog filters. Alternatively, the delta-sigma modulator may be a discrete-time modulator, where the input to the modulator is a sampled version of the analog input signal and the delta-sigma modulator filters are implemented using sampled-data equivalents to the analog filters.

DESCRIPTION OF PREFERRED EMBODIMENTS

The present invention now will be described more fully hereinafter with reference to the accompanying drawings, in which preferred embodiments of the invention are shown. This invention may be embodied in many different forms and should not be construed as limited to the embodiments set forth herein.

Figure 5:
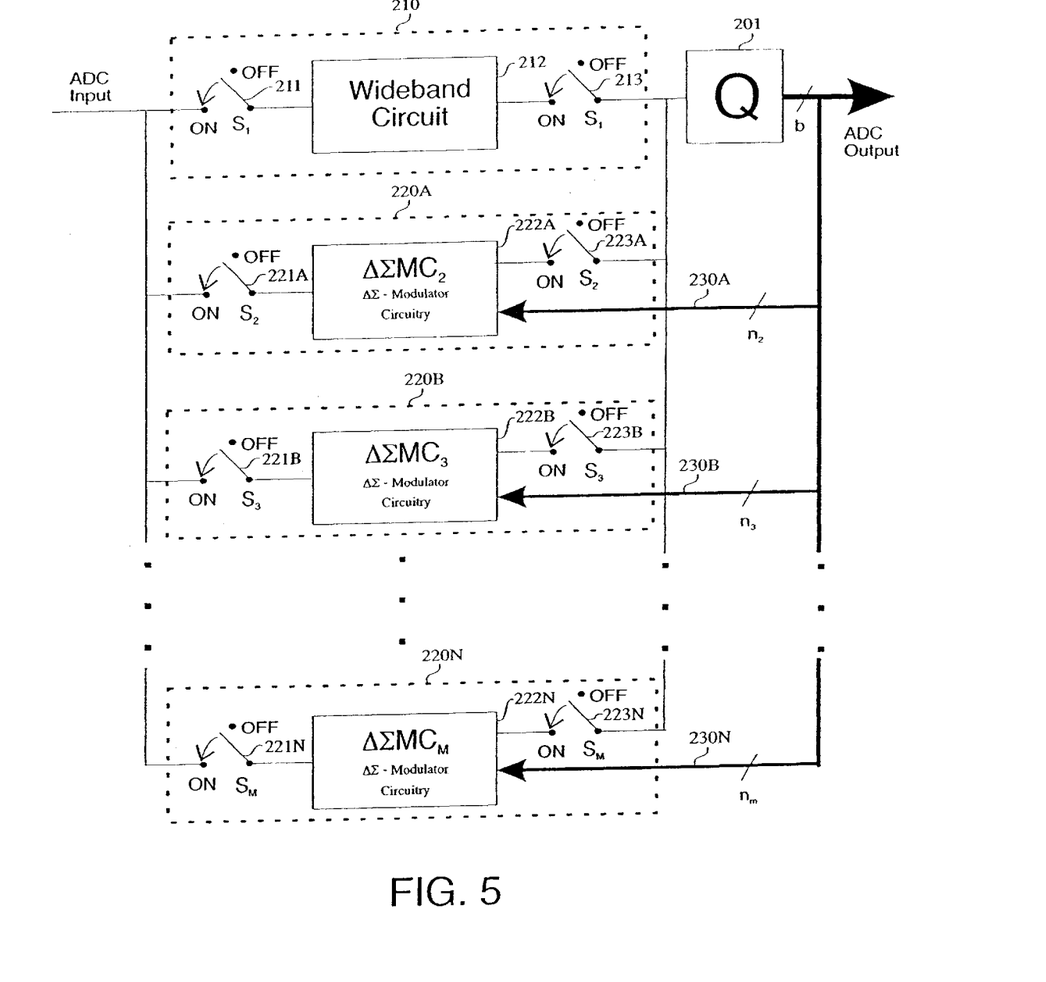
FIG. 5 shows an analog-to-digital converter in accordance with the present invention.

Referring now to FIG. 5, a schematic representation of an apparatus and methods for multiple mode analog-to-digital conversion is shown. In FIG. 5, an analog-to-digital converter comprises a single quantizer 201, a single wideband path 210, a plurality of narrowband paths 220A . . . 220N, and a plurality of feedback paths 230A . . . 230N. The wideband path 210 has a wideband input switch 211, a wideband circuit 212, and a wideband output switch 213. Each narrowband path 220A . . . 220N has an input switch 221A . . . 221N, a delta-sigma modulator circuit 222A . . . 222N, an output switch 223A . . . 223N. Each feedback path 230A . . . 230N is connected from the output of the quantizer 201 to a specific delta-sigma modulator circuit 222A . . . 222N.

The quantizer 201 has a bandwidth greater than or equal to the Nyquist sampling rate for the highest frequency analog signal to be processed by the analog-to-digital converter of the present invention. As previously discussed, the quantizer 201 converts an analog input signal to a discrete level. The quantizer 201 may be a single bit quantizer where the quantizer only outputs two discrete levels. The quantizer 201 may be a multiple bit quantizer where the quantizer output consists of multiple discrete levels coded in a binary fashion such that the output is a number of bits output in parallel. The quantizer 201 is implemented by using architectures well-known in the art, such as the flash architecture previously described. The quantizer 201 can also provide a sample-and-hold function, where an analog signal input to the quantizer is level converted to a discrete level and then held at that level at discrete intervals of time equal to a sampling rate used for the analog-to-digital converter. Alternatively, a sample-and-hold operation may be performed on a signal prior to it being sent to the analog-to-digital converter of the present invention.

In wideband operation, the wideband input switch 211 and wideband output switch 213 are closed. All narrowband input switches 221A . . . 221N and narrowband output switches 223A . . . 223N are opened. An analog signal directed to the input of the analog-to-digital converter is therefore directed solely through the wideband path 210. The analog signal is directed into the input of the wideband circuit. In a preferred embodiment of the present invention, the wideband circuit will provide unity gain on the analog signal. The analog signal output by the wideband circuit is directed to the input of the quantizer 201. If the wideband circuit does not limit the bandwidth of the analog signal, the analog signal will be quantized at the full bandwidth supported by the quantizer. The output of the quantizer comprises the output of the analog-to-digital converter.

In narrowband operation, the wideband input switch 211 and wideband output switch 213 will be opened. One narrowband path will be selected by closing its input switch and output switch, while the input switches and output switches for all other narrowband paths are opened. For example, if narrowband path 220B is selected, narrowband input switch 221B and narrowband output switch 223B are closed. Narrowband input switches 221A, 211C . . . 221N and narrowband output switches 223A, 223C . . . 223N are opened. An analog signal directed to the input of the analog-to-digital converter is therefore directed solely through the selected narrowband path. The analog input signal will be directed into the input of the delta-sigma modulator circuit in the selected path. The output of the delta-sigma modulator is directed to the input of the quantizer 201. The feedback required for the delta-sigma modulator is provided by a specific one of the plurality of feedback paths from the output of the quantizer 201 into the selected delta-sigma modulator circuit. For example, if narrowband path 220B is selected, the feedback required by the delta-sigma modulator circuit 222B is provided by feedback path 230B. The output of the quantizer 201 comprises the output of the analog-to-digital converter.

In another preferred embodiment of the present invention, the quantizer 201 comprises a multiple-bit quantizer. Hence, the output of the analog-to-digital converter comprises the binary form output by the multiple-bit quantizer. In this embodiment, the feedback paths 230A . . . 230N connect one or more of the digital bits output by the quantizer to the delta-sigma modulator circuits 222A . . . 222N in the narrowband paths 220A . . . 220N.

The output of the quantizer 201 as either a single bit or multiple bit quantizer may be provided to additional circuitry for decimation and filtering. Techniques and circuits for providing decimation and filtering are well known in the art. The additional filtering may also provide increased SINAD performance.

Figure 6:
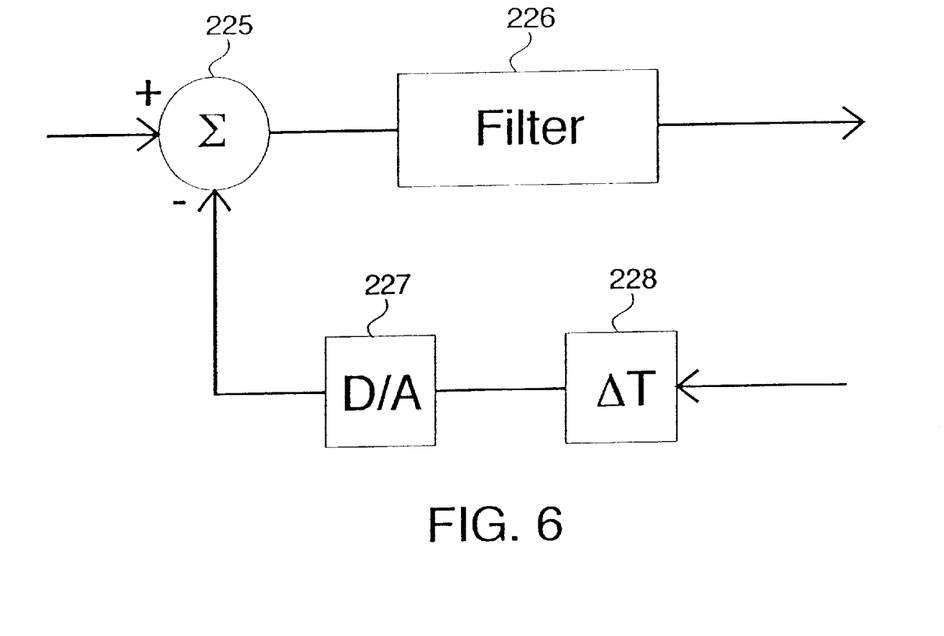
FIG. 6 (prior art) illustrates a delta-sigma modulator circuit.

FIG. 6 shows one embodiment of a delta-sigma modulator circuit used in the present invention. In FIG. 6, a first order delta-sigma modulator circuit comprises a summing node 225, a filter 226, a digital-to-analog converter 227, and a delay element 228. A digital feedback signal is delayed by some period time by the delay element 228 before it is converted to its analog form by the digital-to-analog converter 227. The delay element may also provide no delay. The analog version of the digital feedback signal is subtracted from an analog input signal by the summing node 225 to provide a sum. The sum is input to the filter 226, and the output of the filter is the output of the delta-sigma modulator circuit. Hence, each delta-sigma modulator circuit provides noise shaping for any noise introduced by any elements between the output of the modulator circuit and the corresponding feedback path and filtering for an analog input.

The characteristics of the filter within the delta-sigma modulator circuit in each narrowband path are chosen to provide the desired level of filtering and noise suppression to be provided by that path. For example, the filter within narrowband path 220B can be chosen such that all signals outside of a 10 MHz band centered at 192 MHz are attenuated, while the filter within narrowband path 220A can be chosen such that all signals outside of a 50 MHz band centered at 300 MHz are attenuated. Multiple mode operation is provided by the present invention by using different filter characteristics for each of the narrowband paths 220A . . . 220N. Hence, the present invention supports multiple modes of narrow frequency band operation by using different delta-sigma modulators with different filtering characteristics.

An analog-to-digital converter according to the present invention may be implemented with continuous time delta-sigma modulators. A continuous time delta-sigma modulator uses continuous time analog filters as the filter element with the delta-sigma modulator circuit. These filters can comprise Chebyshev. Butterworth, Bessel, or other analog filter types well known in the art. Those skilled in the art will recognize that such filters can be fabricated from networks of resistors, capacitors and operational amplifiers, or from operational amplifiers and transconductors. Those skilled in the art will also recognize that the quantizer used with continuous time delta-sigma modulators will provide a sample-and-hold function.

Single chip implementation of the analog-to-digital converter according to the present invention may be provided by using continuous time delta-sigma modulators. Raghaven, Jenson, Walden, and Posey disclose a single chip implementation of a single band delta-sigma modulator in "A Bandpass $\Sigma\Delta$ Modulator with 92sB SNR and Center Frequency Continuously Programmable from 0–70 MHz," 1997 IEEE International Solid State Circuits Conference, Section FP13.4, which is incorporated herein by reference. This circuit is implemented in an area of 750×750 $\mu m^2$. A typical chip provides at least six times that area, so a single chip implementation of an analog-digital converter according to the present invention with one wideband path and five narrowband paths could be provided by using the delta-sigma modulator circuit disclosed by Raghaven, et al.

An analog-to-digital converter according to the present invention can also be implemented through the use of discrete time delta-sigma modulators. A discrete time delta-sigma modulator uses delay elements and feedback to implement the filter elements within the delta-sigma modulator circuit. These discrete time filters can also be constructed to emulate Chebyshev, Butterworth, Bessel, or other analog filter types well known in the art.

The signal provided to an analog-to-digital converter according to the present invention using discrete time delta-sigma modulators is sampled and held prior to being input to the circuit. The filter circuits with discrete time delta-sigma modulators may be provided by combinations of operational amplifiers and switched capacitor circuits as is well known in the art. Discrete time delta-sigma modulators are not as amenable to high speed operation as continuous time delta-sigma modulators, due to the implementation requirements for discrete time filters. However, use of discrete time delta-sigma modulators still provides for the implementation of the multiple band capability of the present invention in a single chip. Hairapetian discloses a discrete time implementation of a delta-sigma modulator in "An 81 MHz IF Receiver in CMOS," IEEE Journal of Solid State Circuits, Vol. 21, No. 12, December 1996, incorporated herein by reference, that occupies only a small portion of a single chip. Hence, that circuit could be used in the present invention to provide a multiple band analog-to-digital converter.

The delta-sigma modulator provides noise shaping for any noise introduced by any elements between the output of the modulator and the feedback node. As was heretofore mentioned, the delta-sigma modulator shapes the noise spectrum by decreasing the noise power within the signal band and increasing the noise power outside the signal band. The degree of noise shaping depends on the order of the delta-sigma modulator loop. The operation of a first order modulator has been described. Delta-sigma modulators of higher order known in the art are also used with the present invention.

Figure 7A:
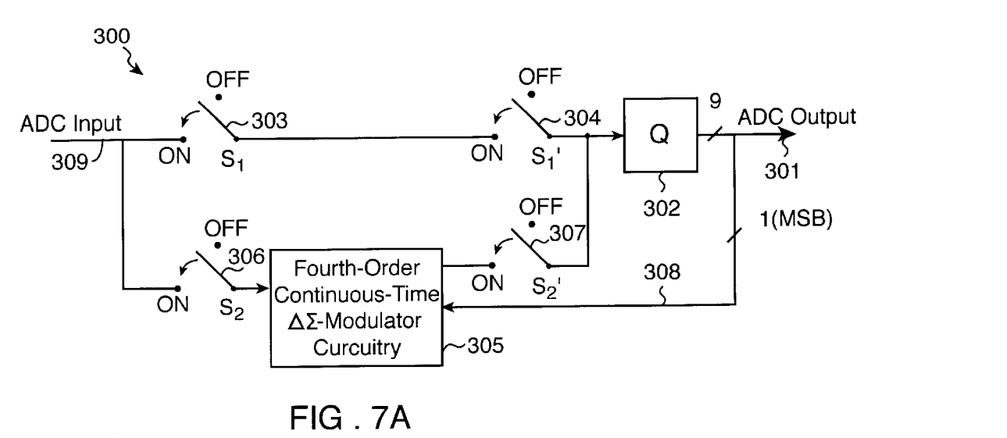
FIG. 7A illustrates an architecture for an analog-to-digital converter that provides a wide band mode and a single narrowband mode with a fourth order delta-sigma modulator circuit in accordance with the present invention.

FIG. 7A shows another embodiment of the present invention that uses a fourth-order continuous-time delta-sigma modulator. This embodiment demonstrates an analog-to-digital converter 300 with a wide band mode and a single narrowband mode. For the wideband mode, switches 303 and 304 are closed to direct the analog signal 309 directly to a nine-bit quantizer 302. Quantizer 302 provides a nine-bit digital parallel output. If the narrowband mode is selected, switches 303 and 304 are opened, and switches 306 and 307 are closed. Thus, the analog input 309 is directed through the delta-sigma modulator 305 and to the quantizer 302. Only the most significant bit (MSB) of the quantizer 302 is fed back to the delta-sigma modulator circuit 305. This will provide for the reduction of quantization noise created by the MSB of the quantizer. Additional quantization noise reduction would be obtained by feeding back additional bits from the quantizer output at the cost of additional circuit complexity and the introduction of additional error terms caused by the multi-bit digital-to-analog conversion required by the delta-sigma modulator.

Figure 7B:
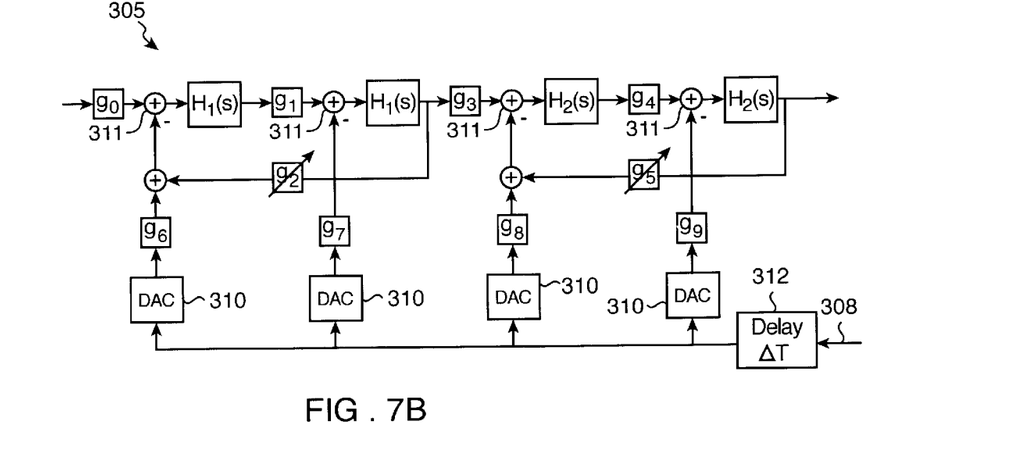
FIG. 7B illustrates the fourth order continuous-time delta-sigma modulator circuit, such as that shown in FIG. 7A.

The architecture of the fourth order continuous-time delta sigma modulator circuit 305 is shown in FIG. 7B. The MSB output of quantizer 302 is fed back into the delta-sigma modulator through path 308. The feedback signal is delayed by a delay element 312 before being converted to its digital form by the single bit D/A converters 310. The multiple orders of the delta-sigma modulator circuit are provided by subtracting the feedback signal from the transformed input signal at summing nodes 311 between the input of the delta-sigma modulator circuit and its output. As indicated previously, the D/A converters could be multiple bit converters to provide additional levels of error correction.

Figure 8A:
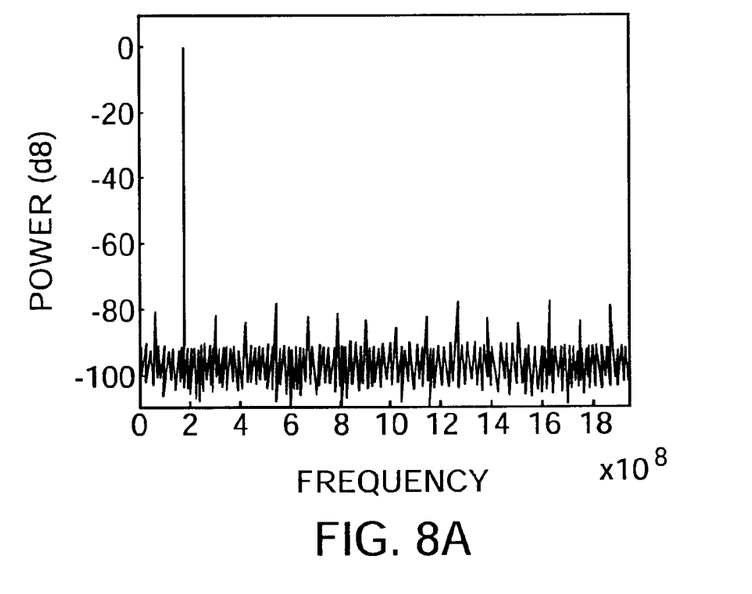
FIG. 8A shows a plot of the simulated Power Spectral Density of the quantizer output when the analog-to-digital converter shown in FIG. 7A is operated in the wide band mode with an input signal of 180 MHz.
Figure 8B:
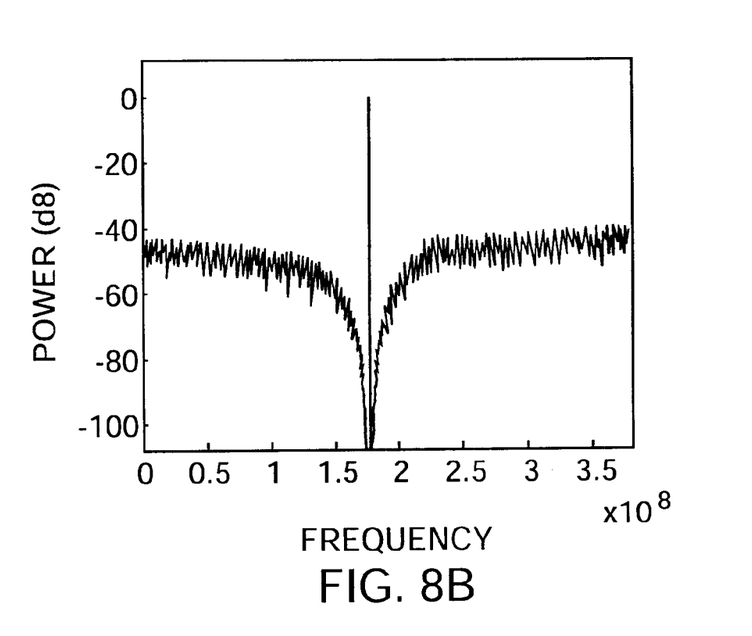
FIG. 8B shows a plot of the simulated Power Spectral Density of the most significant bit of the quantizer when the analog-to-digital shown in FIG. 7A is operated in the narrowband mode with an input signal of 180 MHz.

FIG. 8A shows a plot of the simulated Power Spectral Density (PSD) of the 9-bit quantizer output when driving the analog-to-digital converter with a sinusoidal input of frequency 180 MHz and the wideband mode is selected by closing switches 303 and 304 and opening switches 306 and 307. The quantizer was simulated to sample at a rate of 3.84 GHz. In FIG. 8A, the signal frequency is shown appearing at 180 MHz and at 0 dB while all other frequencies such as those resulting from quantization noise are shown at a −80 to −100 dB. FIG. 8B shows a simulated PSD of the MSB of the quantizer output when the narrowband mode is selected by opening switches 303 and 304 and closing switches 306 and 307. The parameters of the delta-sigma modulator were selected so as to attenuate the quantization noise around 180 MHz. In FIG. 8B, the signal frequency again appears at 180 MHz and 0 dB, while all other frequency components such as those resulting from quantization noise in the immediate vicinity of the signal frequency are greatly attenuated to below −100 dB.

From the foregoing description, it will be apparent that the present invention has a number of advantages, some of which have been described above, and others of which are inherent in the embodiments of the invention described above. Also, it will be understood that modifications can be made to the analog-to-digital converter and the method for analog-to-digital conversion described above without departing from the teachings of subject matter described herein. As such, the invention is not to be limited to the described embodiments except as required by the appended claims.

What is claimed is:

1. An analog-to-digital converter with an input and an output, said analog-to-digital converter comprising:
   a quantizer with an input and an output, said output of said quantizer comprising said output of said analog-to-digital converter;
   a plurality of narrowband paths, each of said narrowband paths comprises:
      input switching means with an input and an output, said input of said input switching means connected to said input of said analog-to-digital converter;
      a delta-sigma modulator circuit with a signal input, a feedback input, and an output, said signal input connected to said output of said input switching means; and
      output switching means with an input and an output, said input of said output switching means connected to said output of said delta-sigma modulator circuit, said output of said output switching means connected to said input of said quantizer; and
   a plurality of feedback paths, said feedback paths connecting said output of said quantizer to said feedback input within each of said narrowband paths.

2. The analog-to-digital converter of claim 1 further comprising:
   at least one wideband path, said wideband path comprises
      input switching means with an input and an output, said input of said input switching means connected to said input of said analog-to-digital converter;
      a wideband circuit with an input and an output, said input of said wideband circuit connected to said output of said input switching means; and
      output switching means with an input and an output, said input of said output switching means connected to said output of said wideband circuit, and said output of said output switching means connected to said input of said quantizer.

3. The analog-to-digital converter of claim 2 wherein said wideband circuit provides a unity gain function between said input of said wideband circuit and said output of said wideband circuit.

4. The analog-to-digital converter of claim 1 wherein said output of said quantizer comprises a plurality of parallel digital bits.

5. The analog-to-digital converter of claim 4 wherein said feedback paths connect at least one of said plurality of parallel digital bits to said feedback input of said delta-sigma modulator circuit within said narrowband paths.

6. The analog-to-digital converter of claim 1 wherein said delta-sigma modulator circuit is a continuous time delta-sigma modulator circuit.

7. The analog-to-digital converter of claim 1 wherein said delta-sigma modulator circuit is a discrete time delta-sigma modulator circuit.

8. The analog-to-digital converter of claim 1 wherein each path of said plurality of narrowband paths provides different filtering characteristics for said analog input signal.

9. A method of multiple mode analog-to digital conversion of an analog signal using a single quantizer, which comprises the steps of:
   directing said analog signal to a plurality of signal paths;
   selecting a selected signal path from said plurality of signal paths, each one of said signal paths comprising a delta-sigma modulator circuit;
   disabling all other signal paths in said plurality of signal paths so that said all other signal paths do not provide an input to said quantizer;
   filtering said analog signal with said delta-sigma modulator circuit in said selected signal path;
   quantizing a filtered signal output by said delta-sigma modulator circuit with said quantizer; and
   feeding back a quantized signal output by said quantizer to said delta-sigma modulator circuit in said selected path.

10. The method of claim 9, wherein each one of said plurality of signal paths has a different signal filtering characteristic dependent upon filtering provided by said delta-sigma modulator in each one of said plurality of signal paths.

11. The method of claim 10, wherein one of said plurality of signal paths comprises a filter with a unity gain function, and which further comprises the steps of:

selecting said one of said plurality of signal paths comprises a filter with a unity gain function;

filtering said analog signal with said filter with a unity gain function;

quantizing a filtered signal output by said filter with a unity gain function; and disabling all other signal paths in said plurality of signal paths so that said all other signal paths do not provide an input to said quantizer.

12. An analog-to-digital converter with an input and an output, said analog-to-digital converter comprising:

a quantizer with an input and an output, said output of said quantizer comprising said output of said analog-to-digital converter;

a plurality of narrowband paths, each of said narrowband paths comprises:

a narrowband input switch having an ON position and an OFF position, said ON position connecting an input of said narrowband input switch to an output of said narrowband input switch, said input of said narrowband input switch connected to said input of said analog-to-digital converter, and said OFF position disconnecting said output of said input narrowband switch from said input of said narrowband input switch;

a delta-sigma modulator circuit with a signal input, a feedback input, and an output, said signal input connected to said output of said input switching means; and, a narrowband output switch having an ON position and an OFF position, said ON position connecting an input of said narrowband output switch to an output of said narrowband output switch, and said OFF position disconnecting said output of said narrowband output switch from said input of said narrowband output switch, said input of said narrowband output switch connected to said output of said delta-sigma modulator circuit, said output of said narrowband output switch connected to said input of said quantizer; and a plurality of feedback paths, said feedback paths connecting said output of said quantizer to said feedback input within each of said narrowband paths.

13. The analog-to-digital converter of claim 12 further comprising:

at least one wideband path, said wideband path comprises a wideband input switch with an ON position and an OFF position, said ON position connecting an input of said wideband input switch to an output of said wideband input switch, said input of said wideband input switch connected to said input of said analog-to-digital converter, and said OFF position disconnecting said output of said wideband input switch from said input of said wideband input switch;

a wideband circuit with an input and an output, said input of said wideband circuit connected to said output of said input switching means;

a wideband output switch with an ON position and an OFF position, said ON position connecting an input of said wideband output switch to an output of said wideband output switch, said input of said wideband output switch connected to said output of said wideband circuit, and said output of said wideband output switch connected to said input of said quantizer, and said OFF position disconnecting said output of said wideband output switch from said input of said wideband output switch.

14. The analog-to-digital converter of claim 13 wherein said wideband circuit provides a unity gain function between said input of said wideband circuit and said output of said wideband circuit.

15. The analog-to-digital converter of claim 12 wherein said output of said quantizer comprises a plurality of parallel digital bits.

16. The analog-to-digital converter of claim 15 wherein said feedback paths connect at least one of said plurality of parallel digital bits to said feedback input of said delta-sigma modulator circuit within said narrowband paths.

17. The analog-to-digital converter of claim 12 wherein said delta-sigma modulator circuit is a continuous time delta-sigma modulator circuit.

18. The analog-to-digital converter of claim 12 wherein said delta-sigma modulator circuit is a discrete time delta-sigma modulator circuit.

19. The analog-to-digital converter of claim 12 wherein each path of said plurality of narrowband paths provides different filtering characteristics for said analog input signal.

* * * * *